United States Patent [19]

Yamada et al.

[11] Patent Number: 5,018,051

[45] Date of Patent: May 21, 1991

[54] IC CARD HAVING CIRCUIT MODULES FOR MOUNTING ELECTRONIC COMPONENTS

[75] Inventors: Hiroshi Yamada, Yokohama; Masayuki Ohuchi, Tokyo; Masayuki Saito, Yokohama; Akinori Hongu, Odawara, all of Japan

[73] Assignee: Kabushiki Kaisha Toshiba, Kawasaki, Japan

[21] Appl. No.: 291,252

[22] Filed: Dec. 28, 1988

[30] Foreign Application Priority Data

Mar. 31, 1988 [JP] Japan .................................. 63-78716

[51] Int. Cl.⁵ ................................................ H05K 7/02
[52] U.S. Cl. .................... 361/393; 361/401; 361/406; 235/492
[58] Field of Search ............... 361/392, 393, 397, 401, 361/406, 414, ; 235/488, 489, 492, 493, 494

[56] References Cited

U.S. PATENT DOCUMENTS

| | | | |
|---|---|---|---|
| 4,616,655 | 10/1986 | Weinberg et al. .................. | 361/401 |
| 4,635,356 | 1/1987 | Ohuchi et al. . | |
| 4,733,061 | 3/1988 | Hegi ..................................... | 235/488 |
| 4,754,319 | 6/1988 | Saito et al. . | |
| 4,755,661 | 7/1988 | Ruebsam ............................. | 235/488 |

OTHER PUBLICATIONS

M. Ohuchi et al., "A New LSI Interconnection Method for IC Cards" IEEE Trans. Components, Hybrids, Manuf. Technol., vol. CHMT-10, No. 3; pp. 310-313 Sep. 1987.

*Primary Examiner*—Leo P. Picard
*Assistant Examiner*—Paramita Ghosh
*Attorney, Agent, or Firm*—Oblon, Spivak, McClelland, Maier & Neustadt

[57] ABSTRACT

An IC card is disclosed which comprises a card-shaped main substrate having a surface on which recess portions are formed and an edge portion having a connector layer with an external connector terminal pattern formed thereon, circuit modules embedded in the recess portions in main substrate, each module having electronic components including IC chips, a chip capacitor and a thin D.C. battery unit, and a double-layered wiring structure for providing electric connection between the electronic components and the connector terminal pattern. The double-layered wiring structure comprises a first wiring layer formed on the main substrate to cover the circuit modules and a second wiring layer formed insulatively above the former wiring layer. The first wiring layer has a first wiring pattern that extends in a first direction of the main substrate to be coupled to the electronic components. The second wiring layer has a second wiring pattern that extends in a second direction of the main substrate to be coupled to the first wiring pattern and the connector terminal pattern.

18 Claims, 2 Drawing Sheets

IC CARD HAVING CIRCUIT MODULES FOR MOUNTING ELECTRONIC COMPONENTS

BACKGROUND OF THE INVENTION

1. Field of the Invention

The present invention relates to IC (integrated circuit) cards, and, more particularly, to a thin IC card having a number of IC chips mounted thereon.

2. Description of the Related Art

External data storage devices having integrated electronic components such as IC's mounted on a thin card-shaped base substrate are generally known as "IC cards." The IC cards have many advantages over a conventional magnetic card having a magnetic tape for data storage, such as significantly larger memory capacity, higher data accessing speed, and higher reliability in storing data. Because of these merits, there is an increasing demand for IC cards.

According to presently available IC cards, for example, IC memory cards, in mounting IC chips on a card-shaped base substrate, these IC chips are mounted on a thin printed board first. Wire bonding or tape-automated bonding (TAB) is employed in electrically connecting connection terminals (bonding pads) of each IC chip to the wiring pattern on the printed board. With such an arrangement, however, it is difficult to make an IC card compact and thin. The use of the wire bonding needs about 0.2 to 0.5 mm high connection wires, which stands in the way of reducing the depth of IC cards. Irrespective of the use of either the wire bonding or TAB, electric connection between each IC chip and the printed board requires a wiring region having twice as large an area as the IC chip, or more, around each IC chip. This inevitably would enlarge the IC card.

A solution to the above problem is proposed in Japanese Patent Disclosure (KOKAI) No. 61-75488 which discloses IC chips directly embedded in a card base substrate without using any printed board. Here, a conductive paste is used to provide the wiring of the IC chips embedded in the card base substrate. According to the disclosed IC card, however, mounting an increased number of IC chips on the card would make it significantly difficult to align the connection terminals of all the embedded IC chips with the wiring pattern provided by the conductive paste. This shortcoming unnecessarily makes the production process of IC cards difficult and complicated.

Two-piece connectors are typically known as means to connect an IC card to an external reading device. Due to their thickness of 2 to 3 mm, the overall IC card cannot be made thinner even if those portions excluding the connector section can be designed in conformity with the ISO standards.

SUMMARY OF THE INVENTION

It is therefore an object of this invention to provide a novel and improved IC card which can ensure effective mounting of an increased number of IC chips as well as being able to be made more compact, and thinner.

In accordance with the above object, this invention is addressed to a specific IC card structure, which has a card-shaped main base layer. This main base layer has a top surface in which recess portions are formed and an edge section at which a connector layer having an external connector terminal pattern is formed. Sub-base layers each having electronic components are disposed in the recess portions. Double-layered wiring means is provided for providing electric connection between the electronic components and connector terminal pattern. This wiring means includes first and second wiring layers. The first wiring layer is disposed on the main base layer in such a way as to cover the sub-base layers and it has wiring lines extending in a first direction of the main base layer and coupled to the aforementioned electronic components. The second wiring layer, insulatively provided above the first wiring layer, has second wiring lines which extend in a second direction of the main base layer and are coupled to the first wiring pattern and connector terminal pattern.

This invention and its objects and advantages will become more apparent from the detailed description of a preferred embodiment of this invention presented below.

DETAILED DESCRIPTION OF THE PREFERRED EMBODIMENTS

Figure 1:
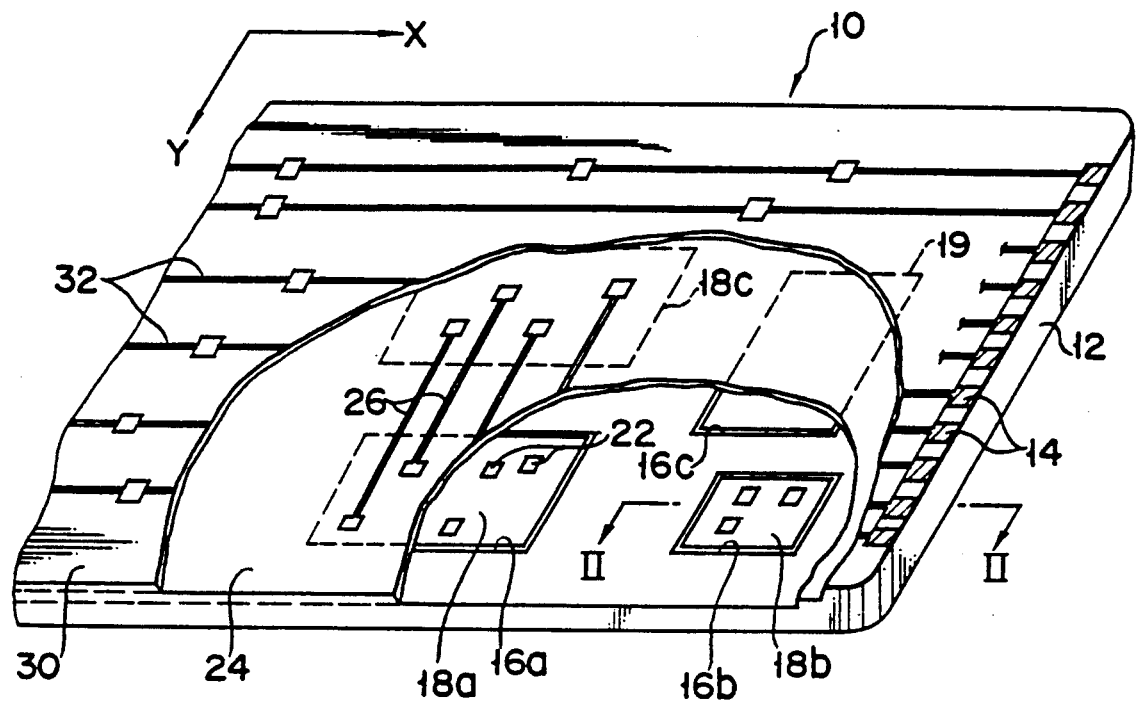
FIG. 1 is a partly cutaway perspective view illustrating the structure of the essential section of an IC card according to one preferred embodiment of this invention.

Referring now to FIG. 1, an IC card according to one embodiment of this invention is generally designated by reference numeral "10." IC card 10 has insulative base substrate (hereinafter called "main substrate" or "card substrate") 12, which may be a glass epoxy resin base layer having a rectangular surface. Card substrate 12 has a plane type external connector terminal pattern 14 formed at one short edge portion on its top surface, using a conductive thin film of Au, Ag, Cu, etc.

As shown in FIG. 1, card substrate 12 has a selected number of recess portions 16a, 16b, 16c and so forth formed in its top surface. Where it is not necessary to distinguish one recess portion from another, the suffixes may be dropped. Each of recess portions 16 has a rectangular plane shape and is formed in card substrate 12 so as to have a predetermined depth. Circuit modules 18a, 18b, 18c, ... and a power source unit 19 are embedded in the respective recess portions 16 and are secured there by insulative hardenable resin 20. The cross-sectional view of FIG. 2 most clearly illustrates each circuit module 18 being secured in its associated recess portion 16 by means of hardenable resin 20. Circuit modules 18 serve as subwiring substrates on which IC chips are mounted. Power source unit 19 is a thin type D.C. battery unit. Subwiring substrates 18 have connection terminal pads 22.

The top surface of card substrate 12 having circuit modules 18 embedded therein is entirely covered with a first insulative layer 24. Parallel wiring pattern lines 26 are formed on first insulative layer 24 using a conductive paste and extend in the Y direction of IC card 10. These wiring pattern lines 26 are coupled to connection terminal pads 22 of circuit modules 18 via through-holes 28 (see FIG. 2) formed in first insulative layer 24. This connection permits a certain connection terminal pad 22 of a certain circuit module 18 to be coupled to the corresponding connection terminal pad of another circuit module 18.

Figure 2:
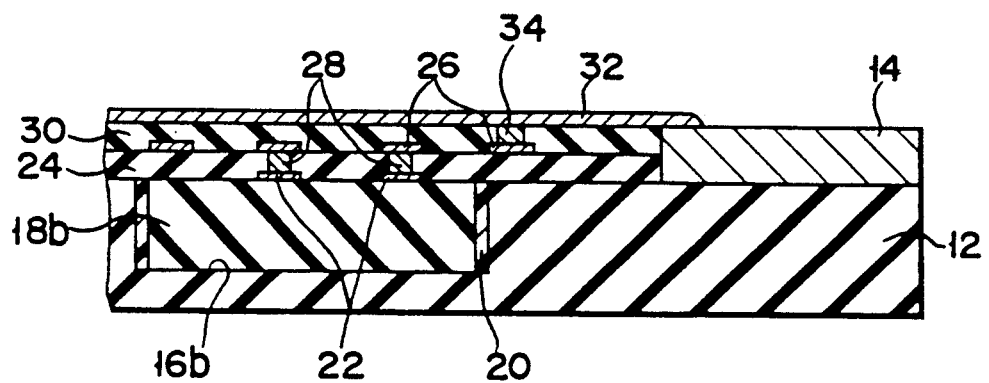
FIG. 2 is a cross-sectional view of the IC card of FIG. 1 taken along the line II—II.

A second insulative layer 30 is disposed on first insulative layer 24. It should be clear from FIG. 2 that the double-layered structure of first and second insulative layers 24 and 30 has the same thickness as connector terminal pattern 14. Parallel wiring pattern lines 32 extending in the X direction of IC card 10 are formed on second insulative layer 30 using a conductive paste, and they are coupled to connector terminal pattern 14. Wiring lines 32 are coupled to underlying wiring pattern lines 26 via through holes 34 (see FIG. 2) formed in second insulative layer 30. The cross-sectional view of FIG. 2 illustrates one wiring line 32 being electrically coupled to the corresponding one of wiring pattern lines 26 via through hole 34. With the use of mutually insulated wiring lines 26 and 32 which intersect each other at right angles on a plane, connection terminal pad 22 of a certain circuit module (e.g., 18a) can be, if necessary, electrically coupled to connector terminal pattern 14.

Figure 3:
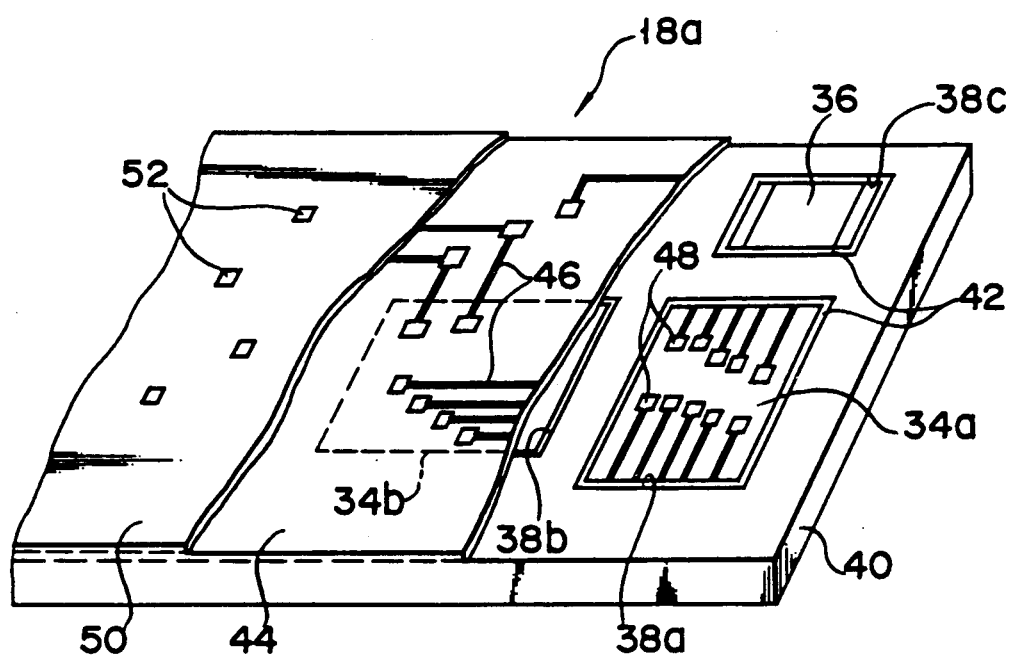
FIG. 3 is a partly cutaway, enlarged perspective view illustrating the structure of the essential section of a circuit module of the IC card shown in FIG. 1.

As shown in an enlarged view in FIG. 3, circuit module 18a typically includes IC chips 34a, 34b, ... and chip capacitor 36, which are embedded in rectangular recess portions 38a, 38b, 38c, ... and secured there by means of insulative hardenable resin 42. IC chips 34 may be memory chips.

Base layer 40 in which electronic components 34 and 36 are embedded has its top surface entirely covered with an insulative thin film layer 44 on which connection wiring lines 46 are formed using a conductive paste. Connection wiring lines 46 include wiring lines extending in two different, mutually normal directions to thereby provide a circuit module internal wiring pattern. These wiring lines 46 are coupled to connection terminals 48 of IC chips 34 via through-holes (not shown) formed in insulative layer 44 to thereby provide electric connection between IC chips 34. Another insulative thin film layer 50 is disposed on insulative layer 44. Wiring lines 46 are coupled to connection terminal pads 52 formed on the top surface of insulative layer 50 via through-holes (not shown) formed therein. These connection terminal pads 52 serve as external connection terminals of circuit module 18a.

With such an arrangement, many IC chips 34 are mounted on a selected number of circuit modules 18, and since connection terminals 52 for the mounted IC chips are formed together in the individual circuit modules 18, it is possible to realize a high density mounting of an increased number of IC chips 34 on card substrate 12. This reduces the wiring region in IC card 10 and therefore contributes to compactness of the card. In addition, since the number of terminals involved in wiring connection is reduced, the wiring alignment can be more accurate as compared with the case where direct connection wiring is provided between all the IC chips 34 and card substrate 12. This can improve the reliability of the wiring. Further, since the electric wiring connection between circuit modules 18 and connector terminal pattern 14 of card substrate 12 is realized by means of double-layered wiring pattern lines 26 and 32, not using the conventional wire bonding nor TAB, IC card 10 can be made thin. Particularly, first and second insulative layers 24 and 30 can be formed on card substrate 12 to have substantially the same thickness as that of the surface edge portions of card substrate 12, IC card 10 can be made thinner.

IC card 10 of the above embodiment can be effectively produced through the processes described below. First, base layer 40 for each circuit module 18 is prepared. IC chips 34 and chip capacitor 36 are respectively installed in recess portions 38 of base layer 40. UV hardenable resin 42 is put in each recess portion 38 and is hardened through irradiation of ultraviolet rays to secure elements 34 and 36. The resultant structure is subjected to a screen printing process to thereby form, on base substrate 40, insulative layer 44 of hardenable resin having openings at those positions corresponding to the connection terminals (electrodes) of IC chips 34. Metal is fitted in the openings to provide through holes. Then, screen printing is effected to form wiring lines 46 on insulative layer 44. Similarly, insulative layer 50 is formed on insulative layer 44 using a UV hardenable resin, and connection terminal pads 52 are formed on insulative layer 50 through the same screen printing, as shown in FIG. 3.

Then, fabricated circuit modules 18 and power source unit 19 are disposed in the respective recess portions of card substrate 12 and are secured there by UV hardenable resin 20 in the same manner as is described above. Subsequently, a UV hardenable resin serving as first insulative layer 24 is deposited on the entire surface of card substrate 12. Selective etching is then effected to form openings corresponding to through holes 28, in first insulative layer 24. The reason why the UV hardenable resin is deposited on card substrate 12 without using the screen printing is that the top surface of card substrate 12 on which elements 18 and 19 are mounted is not flat and has upheavals, thus making it difficult to evenly form first insulative layer 24 through screen printing. The deposition of the UV hardenable resin as first insulative layer 24 on the entire surface of card substrate 12 can make first insulative layer 24 flat.

After metal is fitted in the openings of first insulative layer 24 to form through holes 28, parallel wiring lines 26 are formed on this insulative layer 24 using a conductive paste. A UV hardenable resin having openings corresponding to through-holes 34 is formed as second insulative layer 30 on first insulative layer 24 through screen printing. After metal is fitted in these openings to form through holes 34, parallel wiring lines 32 are formed on this insulative layer 30 using a conductive paste. It should be noted that, in the above production process, in view of the thermal expansion and high adhesiveness, it is preferable to use the same resin material for resin 42 for securing the electronic components including IC chips 34 and capacitor 36 in circuit modules 18, resin 20 for securing circuit modules 18 on card substrate 12 and the resin for providing electrical insulation for double-layered wiring pattern lines 26 and 32, IC chips 34, etc.

According to the above IC card manufacturing method, the process for wiring between IC chips 34 and card substrate 12 is divided into two steps: the first one for providing the wiring in each circuit module 18 after IC chips 34 are installed on the circuit module 18 and the second one for providing the wiring on card substrate 12 after individual circuit modules 18 are mounted on the card substrate 12. As a result, the number of connection terminals subjected to wiring in each wiring process can be limited even in the case where the number of IC chips 34 to be mounted on IC card 10 is increased. Accordingly, the alignment of the electronic components in the wiring process can be simplified and the alignment accuracy can be improved, thus ensuring the manufacture of highly reliable IC cards each with electronic components installed thereon with a high density.

Although the invention has been described with reference to a specific embodiment, it shall be understood by those skilled in the art that numerous modifications may be made that are within the spirit and scope of the inventive contribution. For instance, a stainless substrate may serve as card substrate 12, and IC chips 34 installed on card substrate 12 are not restricted to memory chips, but may be a group of IC chip elements including a microprocessor chip, numerical processor chip or the like.

What is claimed is:

1. A structure comprising:
   (a) a card-shaped main base layer having a surface in which recess portions are formed and a connector layer having an external connection terminal pattern formed at an edge portion thereof;
   (b) sub-base layers embedded in said recess portions of said main base layer and each having electronic components; and
   (c) double-layered wiring means for providing electric connection between said electronic components and said connector terminal pattern, said wiring means comprising,
   (d) a first wiring layer disposed on said main base layer so as to cover said sub-base layers and having a first wiring pattern which substantially consists of essentially parallel wiring lines extending in a first direction of said main base layer to be coupled to said electronic components, and
   (e) a second wiring layer insulatively provided above said first wiring layer and having a second wiring pattern which substantially consists of essentially parallel wiring lines extending in a second direction of said main base layer to be coupled to said first wiring pattern and said connector terminal pattern.

2. The structure according to claim 1, wherein said first wiring pattern includes wiring lines for providing electrical connection between said electronic components of said sub-base layers embedded in said main base layer.

3. The structure according to claim 2, wherein said second wiring pattern includes wiring lines for providing electric connection between said connector terminal pattern and said wiring lines of said first wiring pattern.

4. The structure according to claim 1, wherein said first wiring pattern is substantially perpendicular to said second wiring pattern.

5. A structure comprising:
   (a) a card-shaped main base layer having a surface in which recess portions are formed and a connector layer having an external connection terminal pattern formed at an edge portion thereof;
   (b) sub-base layers embedded in said recess portions of said main base layer and each having electronic components; and
   (c) double-layered wiring means for providing electric connection between said electronic components and said connector terminal pattern, said wiring means comprising,
   (d) a first wiring layer disposed on said main base layer so as to cover said sub-base layers and having a first wiring pattern extending in a first direction of said main base layer to be coupled to said electronic components, and
   (e) a second wiring layer insulatively provided above said first wiring layer and having a second wiring pattern extending in a second direction of said main base layer to be coupled to said first wiring pattern and said connector terminal pattern,
   (f) said first wiring pattern includes wiring lines for providing electrical connection between said electronic components of said sub-base layers embedded in said main base layer.
   (g) said second wiring pattern includes wiring lines for providing electric connection between said connector terminal pattern and said wiring lines of said first wiring pattern,
   (h) said double-layers wiring means has substantially the same thickness as said connector layer.

6. The structure according to claim 5, further comprising:
   (d) securing means for securing each of said sub-base layers in a corresponding one of said recess portions.

7. The structure according to claim 6, wherein said securing means includes a hardenable resin.

8. The structure according to claim 7, wherein said electronic components include semiconductor integrated circuit devices.

9. An IC card comprising:
   (a) a card substrate having a main surface in which first recess portions are formed and having plane connector terminals at an edge surface thereof;
   (b) circuit modules embedded in said first recess portions and each having a base layer having a surface in which second recess portions are formed;
   (c) integrated circuit chips embedded in said second recess portions and each having connection terminals;
   (d) first double-layered wiring means for providing electric connection between said connection terminals of said integrated circuit chips in each of said circuit modules to thereby provide circuit module connection terminals; and
   (e) second double-layered wiring means, so formed on said main surface of said card substrate as to cover said circuit modules, for providing connection between said circuit modules and connection between said circuit module connection terminals and said plane connector terminals, said second wiring means including first parallel wiring line components insulatively provided above said card substrate and extending in a selected direction, and second parallel wiring line components insulatively provided above said first wiring line components and extending in a different direction substantially perpendicular to the selected direction.

10. An IC card comprising:
    (a) a card substrate having a main surface in which first recess portions are formed and having plane connector terminals at an edge surface thereof;
    (b) circuit modules embedded in said first recess portions and each having a base layer having a surface in which second recess portions are formed;
    (c) integrated circuit chips embedded in said second recess portions and each having connection terminals;
    (d) first double-layered wiring means for realizing electric connection between said connection terminals of said integrated circuit chips in each of said circuit modules to thereby provide circuit module connection terminals; and (e) second double-layered wiring means, so formed on said main surface of said card substrate as to cover said circuit modules, for providing connection between said circuit modules and connection between said circuit module connection terminals and said plane connector terminals, said second wiring means including first parallel wiring line components insulatively provided above said card substrate and extending in a selected direction, and second parallel wiring line components insulatively provided above said first wiring line components and extending in a different direction substantially perpendicular to the selected direction, wherein said first double-layered wiring means comprises:

a first insulative thin film having first through holes formed to cover said surface of said base layer;

a circuit module wiring pattern formed on said first insulative thin film and having wiring lines extending in two different normal directions to be coupled to said connection terminals of said integrated circuit chips via said first through holes; and a second insulative thin film formed on said first insulative thin film to cover said circuit module wiring pattern, and having second through holes and having said circuit module connection terminals thereon, said circuit module wiring pattern being coupled to said circuit module connection terminals via said second through holes.

11. The IC card according to claim 10, wherein said second double-layered wiring means comprises:

a first insulative layer having third through holes so formed as to cover said main surface of said card substrate;

a first card wiring pattern formed on said first insulative layer and having wiring lines serving as said first wiring line components and extending in the selected direction to be coupled to said circuit module connection terminals via said third through holes;

a second insulative layer so formed on said first insulative layer as to cover said first card wiring pattern and having fourth through holes; and a second card wiring pattern formed on said second insulative layer and having wiring lines serving as said second wiring line components and extending in said different direction to be coupled to said plane connector terminals and coupled via said fourth through holes to said first card wiring pattern.

12. The IC card according to claim 11, wherein said wiring lines of said circuit module wiring pattern and said card wiring pattern are formed of a conductive paste.

13. The IC card according to claim 12, wherein said integrated circuit chips and said circuit modules are secured in said first and second recess portions by means of a hardenable resin.

14. The IC card according to claim 13, wherein said first and second insulative thin films and said first and second insulative layers are formed of the same resin material as that of said hardenable resin.

15. The IC card according to claim 14, wherein said second insulative layer of said second double-layered wiring means is substantially level with said plane connector terminals.

16. The IC card according to claim 15, wherein said integrated circuit chips include memory chips.

17. The IC card according to claim 16, wherein said circuit modules include a D.C. power source unit.

18. The IC card according to claim 17, wherein said card substrate has a rectangular plane shape.

* * * * *